US011159010B1

United States Patent
Patterson

(10) Patent No.: US 11,159,010 B1
(45) Date of Patent: Oct. 26, 2021

(54) APPARATUS AND METHOD FOR PRODUCING NEGATIVE SEQUENCE CURRENT

(71) Applicant: Russell W. Patterson, Chattanooga, TN (US)

(72) Inventor: Russell W. Patterson, Chattanooga, TN (US)

(*) Notice: Subject to any disclaimer, the term of this patent is extended or adjusted under 35 U.S.C. 154(b) by 0 days.

(21) Appl. No.: 17/313,510

(22) Filed: May 6, 2021

Related U.S. Application Data

(60) Provisional application No. 63/026,828, filed on May 19, 2020.

(51) Int. Cl.
*H02H 7/00* (2006.01)
*H02H 7/122* (2006.01)
*H02H 1/00* (2006.01)

(52) U.S. Cl.
CPC .......... *H02H 7/122* (2013.01); *H02H 1/0007* (2013.01)

(58) Field of Classification Search
None
See application file for complete search history.

(56) References Cited

U.S. PATENT DOCUMENTS

| 4,398,232 A * | 8/1983 | Elmore | H02J 3/26 361/47 |
| 6,525,543 B1 * | 2/2003 | Roberts | H02H 3/343 324/522 |
| 7,319,576 B2 * | 1/2008 | Thompson | H02H 7/045 361/76 |
| 8,004,222 B2 * | 8/2011 | Maddali | H02P 6/185 318/400.34 |
| 10,288,688 B2 * | 5/2019 | Kasztenny | G01R 31/343 |

* cited by examiner

*Primary Examiner* — Stephen W Jackson
(74) *Attorney, Agent, or Firm* — Chambliss, Bahner & Stophei, P.C.; Stephen D. Adams

(57) ABSTRACT

A method for providing negative sequence current to a bus of an IBR-based power system includes the steps of monitoring phase voltages at terminals connected to the power system and determining a reference phasor of a negative sequence voltage incident on the terminals. A rotation phasor is applied to the reference phasor based on an angular offset between a negative sequence voltage and a corresponding negative sequence current to obtain a first outbound negative sequence current having a first magnitude and a first phase angle. The first outbound negative sequence current is scaled to obtain a second outbound negative sequence current having a second magnitude that is different from the first magnitude and is oriented at the first phase angle. The second outbound negative sequence is provided to the bus of the power system.

19 Claims, 6 Drawing Sheets

APPARATUS AND METHOD FOR PRODUCING NEGATIVE SEQUENCE CURRENT

CROSS-REFERENCE TO RELATED APPLICATIONS

This application claims the benefit of U.S. Provisional Application No. 63/026,828 filed May 19, 2020, and entitled APPARATUS AND METHOD FOR PRODUCING NEGATIVE SEQUENCE CURRENT, which is incorporated herein by reference in its entirety.

FIELD

The invention relates generally to electrical power systems. More particularly, the present invention relates to an apparatus and method for producing only negative sequence current for use in detecting fault conditions in the presence of inverter-based resources.

BACKGROUND

In the field of electrical power systems, faults must be analyzed before an appropriate response can be implemented. Analyzing faults in three-phase power systems is relatively straightforward when the fault is "symmetrical" or "balanced". A balanced fault is one that affects all three phases equally, such as when all three phases are shorted to ground. The analysis of balanced faults is straightforward. However, the majority of faults in power systems are "asymmetrical" or "unbalanced" faults, where all three phases are not affected equally. Unfortunately, analyzing faults in three-phase unbalanced networks was quite tedious prior to the advent of computer methods, especially if the networks were large.

The analysis was simplified through the use of symmetrical components, which may be used to translate a single three-phase unbalanced system, comprised of a set of three unbalanced phasors (e.g. $V_a$, $V_b$, $V_c$), into three separate balanced components. For example, with reference to FIG. 1, there is shown a typical three-phase unbalanced system 10 that is represented as three unbalanced phasors ($V_a$, $V_b$, $V_c$). These phasors are "unbalanced" because they have a different magnitude (i.e., length) and/or are arranged with an angle other than 120 degrees between them. Using symmetrical components, this single unbalanced system 10 can be transformed into three balanced sets of phasors that are typically referred to as the positive sequence 20, the negative sequence 30 and the zero sequence 40. In this illustrated embodiment, sequences for voltage are illustrated. Corresponding sequences also exist for current.

The positive sequence 20 is a balanced three-phase set that has the same phase sequence ($V_{a1}$, $V_{b1}$, $V_{c1}$) as the original sequence of system 10. The negative sequence 30 is a balanced three-phase set with the opposite phase sequence ($V_{a2}$, $V_{b2}$, $V_{c2}$) to the original sequence of system 10. The positive sequence 20 and negative sequence 30 sets are balanced because the phasors in each sequence, namely ($V_{a1}$, $V_{b1}$, $V_{c1}$) and ($V_{a2}$, $V_{b2}$, $V_{c2}$), are equal in magnitude and there is an angle of 120 degrees between each of the component phasors. Lastly, in the zero sequence, all three phasors ($V_{a0}$, $V_{b0}$, $V_{c0}$) are equal both in magnitude and phase. Advantageously, these individual balanced systems 20, 30, 40 can then be interconnected, solved and then recombined to find the resulting phase quantities (i.e., voltage and current) under fault conditions of the entire system 10. Before the common use of computers this symmetrical component method of analyzing unbalanced power systems was prevalent.

The positive sequence 20 represents a balanced load. Therefore, when a system is operating normally (i.e., without faults and with equal phase currents that are displaced by exactly 120 degrees), only a positive sequence 20 current results. However, when an unbalanced fault is present in a system, at least one of a negative sequence 30 and/or a zero sequence 40 is produced in addition to the positive sequence 20. These effects can be detected with sequence filters. For that reason, protective relay designers have designed protective relay elements that take advantage of symmetrical components to detect negative sequences 30, which are indicative of an unbalanced system fault and are used to determine direction to the fault. These detection methods require faults to produce currents that have at least a minimum negative sequence amplitude. Additionally, these methods are designed based around the predictable phase angle that is typically found between the negative sequence current and the negative sequence voltage during a fault condition when the source of fault current is synchronous generators.

In conventional power generation systems (e.g., gas, coal, hydro, etc.), where synchronous generators interface between the power generation plant and the electric power transmission and distribution grid (the "grid"), the magnitude of the negative sequence voltage and the negative sequence current is ample in quantity and their phase relationship is predictable. An unbalanced fault condition in a forward direction results in the negative sequence current leading the negative sequence voltage at the measurement location by approximately 90 degrees. An unbalanced fault condition in a reverse direction results in the negative sequence current lagging the negative sequence voltage at the measurement location by approximately 90 degrees.

As concerns about climate change, fuel prices and energy security increase, there has been an increase in the amount of renewable energy sources (e.g., wind, solar, etc.) that are connected to the grid. Unlike the conventional power generation systems discussed above, which interface with the grid via synchronous generators, these types of renewable energy converters or sources interface with the grid via power electronic inverters. For this reason, these renewable energy sources are often commonly referred to as "inverter-based resources" or IBRs. While the fault response of generator-based systems is based on well-known physics, the fault response of IBR-based systems is controlled by algorithms (i.e., software) that control the operation of the power electronics. As discussed further below, since software is used to control the fault response of IBR-based systems instead of the predictable response seen with synchronous machines, that response can be much more unpredictable.

Referring now to FIG. 2, there is provided a conventional electrical power generation and distribution system 50 that includes a power generation portion 52 having an IBR 54, such as a solar panel array or another green (i.e., renewable) power generation source. The system 50 includes a power transmission portion 56 that is connected to the power generation portion 52 via a step-up transformer 58. The power transmission portion 56 includes a conventional protective relay 60 that is used in isolating and protecting the system 50 against faults 62. Detecting and addressing unbalanced faults in IBR systems, such as the system 50, using conventional protective relays, such as relay 60, is difficult because the magnitude of the negative sequence current produced by IBRs may be insufficient and the phase angle incorrect.

First, all negative sequence protective relays must be provided at least a minimum amount of negative sequence current before they will attempt to make a decision in detecting and addressing a fault. In many cases, this minimum amount is approximately ½ amp secondary. The term "secondary" means the current fed to the relay from a current transformer (CT). A typical CT ratio in the utility system would be 1200/5 (240:1). As such, a ½ amp secondary equates to 120 A primary. However, there is a limit to the amount of current that an IBR can produce and IBRs are designed to primarily produce positive sequence current. For that reason, the amount of negative sequence current that IBRs can produce during an unbalanced fault condition is limited and is typically insufficient in amplitude and/or angle to trigger the protective relay and to enable the protective relay to function properly and predictably.

Next, the amount of negative sequence current produced by IBRs is also lower than synchronous generators due to the physical differences between inverters and generators. The software-controlled electronics found in inverters lack the rotational inertia of a rotor that is found in synchronous generators. For this reason, the magnitude of the negative sequence current produced by these sources is often much less than the negative sequence current produced in conventional power systems by synchronous generators.

Finally, existing IBR installations predominately produce negative sequence current in the wrong phase relationship. In the case of IBRs, the phase relationship between the negative sequence current and the negative sequence voltage is often not 90 degrees as it is with synchronous generation. There is typically some other, non-90 degree offset between the negative sequence current and negative sequence voltage. For this reason, existing protective relays cannot reliably determine the fault direction (i.e., forward or reverse) and cannot provide an appropriate response when used in connection with IBRs. In some cases, protective relays might fail to function altogether when used in connection with IBRs.

One proposed solution for this issue is to replace conventional components with those that are better suited for IBR installations. For example, it may be possible to utilize a protective relay having a lower minimum negative sequence current requirement. However, these conventional protective relays are ubiquitous and replacing all of them would be time consuming and expensive. It would be much more economical to correct the issue at the source (i.e. at the IBR) than to correct the issue at the grid. Additionally, simply lowering the minimum negative sequence current requirement would not address the incorrect phase angle issue.

What is needed, therefore, is a device that may be connected to an existing utility bus associated with IBRs that is designed specifically to produce the required negative sequence current at an appropriate magnitude and at the proper phase relationship to the negative sequence voltage to enable existing protective relay elements to function properly even when the negative sequence current provided by the IBRs has an insufficient magnitude or phase angle to enable the protective relay elements to function properly.

Notes on Construction

The use of the terms "a", "an", "the" and similar terms in the context of describing embodiments of the invention are to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. The terms "substantially", "generally" and other words of degree are relative modifiers intended to indicate permissible variation from the characteristic so modified. The use of such terms in describing a physical or functional characteristic of the invention is not intended to limit such characteristic to the absolute value which the term modifies, but rather to provide an approximation of the value of such physical or functional characteristic.

Terms concerning attachments, coupling and the like, such as "attached", "connected" and "interconnected", refer to a relationship wherein structures are secured or attached to one another either directly or indirectly through intervening structures, as well as both moveable and rigid attachments or relationships, unless otherwise specified herein or clearly indicated as having a different relationship by context. The term "operatively connected" is such an attachment, coupling or connection that allows the pertinent structures to operate as intended by virtue of that relationship.

The use of any and all examples or exemplary language (e.g., "such as" and "preferably") herein is intended merely to better illuminate the invention and the preferred embodiments thereof, and not to place a limitation on the scope of the invention. Nothing in the specification should be construed as indicating any element as essential to the practice of the invention unless so stated with specificity.

Summary

The above and other problems are addressed by a method for providing negative sequence current to a bus of an IBR-based power system to facilitate operation of a protective relay of the power system in protecting the power system. The method includes the steps of, using a negative sequence converter (NSC) device connected to the power system via terminals, monitoring phase voltages of the power system at the terminals. Using the NSC device, a reference magnitude and reference phase angle of a negative sequence voltage incident on the NSC device is determined based on phase voltages of the power system. Using the NSC device, a first model current is provided. The first model current has a first magnitude and a first phase angle based on the reference magnitude and reference phase angle. A second model current having a second magnitude and second phase angle is provided using the NSC device. The second model current to the power system bus using the NSC device. In preferred embodiments, the second model current provided to the power system bus consists only of negative sequence current.

In certain embodiments, the phase angle of the first model current is equal to the reference phase angle of the negative sequence voltage incident on the NSC device rotated by 90 degrees. In certain embodiments, the first magnitude is equal to the reference magnitude of the negative sequence voltage.

In certain embodiments, the second model current comprises three phases, each with a second magnitude and a second phase angle, wherein the second magnitude for each phase is equal to one another and wherein 120 degrees separates the second phase angles of each of the phases. More preferably, the first model current includes three phases, each with a first phase angle. Each one of the three phases of the first model current corresponds with one of the three phases of the second model current, and 120 degrees separates the first phase angles of each of the three phases of the first model current and 180 degrees separates the first phase angles of each phase of the first current model from the second phase angle of each corresponding phase of the second current model. In certain embodiments, the power system includes an inverter having a current capability and the second magnitude to each phase of the second model current is equal to the current capability of the inverter.

In certain embodiments, the method further includes the step of detecting a fault in the power system using the NSC device when a system voltage is below a pre-selected threshold percentage of a nominal voltage for the power system. Additionally, once a fault is detected, the NSC device switches from a non-fault mode of operation to a fault mode of operation. In certain cases, the NSC device switches from the non-fault mode of operation to the fault mode of operation when the system voltage falls below 80% of the nominal voltage for the power system.

In certain cases, the NSC device switches from the non-fault mode of operation to the fault mode of operation when the system voltage falls below 70% of the nominal voltage for the power system. Preferably, the NSC device carries out a secondary, non-fault related function when in non-fault mode. In certain embodiments, the NSC device functions as a static VAR compensator in the non-fault mode. In certain embodiments, the NSC device improves nominal power quality in the non-fault mode.

More generally, the present disclosure provides a method for providing negative sequence current to a bus of an IBR-based power system to facilitate operation of protective relays in protecting the power system. The method includes the steps of monitoring phase voltages at terminals connected to the power system and then determining a reference phasor of a negative sequence voltage incident on the terminals having a reference magnitude and reference phase angle. The method also includes the step of applying a rotation phasor to the reference phasor based on an angular offset between the negative sequence voltage and a corresponding negative sequence current to obtain a first outbound negative sequence current having a first magnitude and a first phase angle. The method then provides for scaling the first outbound negative sequence current to obtain a second outbound negative sequence current having a second magnitude that is different from (i.e., either greater than or less than) the first magnitude and that is oriented at the first phase angle. Preferably, the first outbound negative sequence current is scaled such that the second magnitude equals a current capacity of an inverter of the power system. Lastly, the second outbound negative sequence is provided to the bus of the power system. Preferably, the second outbound negative sequence includes a first phase, second phase, and third phase that each have a magnitude equal to the second magnitude and wherein 120 degrees separates each adjacent phase.

The method may further include the step of providing a first phase of the outbound negative sequence having a magnitude equal to the second magnitude and a phase angle obtained by applying a first rotation phasor to the reference phasor, where the first rotation phasor is based on the angular offset between the negative sequence voltage and corresponding negative sequence current; providing a second phase of the outbound negative sequence having a magnitude equal to the second magnitude and a phase angle obtained by applying a second rotation phasor to the reference phasor, where the second rotation phasor is based on the angular offset between the negative sequence voltage and corresponding negative sequence current; and providing a third phase of the outbound negative sequence having a magnitude equal to the second magnitude and a phase angle obtained by applying a third rotation phasor to the reference phasor, where the third rotation phasor is based on the angular offset between the negative sequence voltage and corresponding negative sequence current. In that case, 120 degrees preferably separates the phase angles of the first phase, second phase, and third phase of the outbound negative sequence.

BRIEF DESCRIPTION OF THE DRAWINGS

Further advantages of the invention are apparent by reference to the detailed description when considered in conjunction with the figures, which are not to scale so as to more clearly show the details, wherein like reference numerals represent like elements throughout the several views, and wherein.

DETAILED DESCRIPTION

Figure 1:
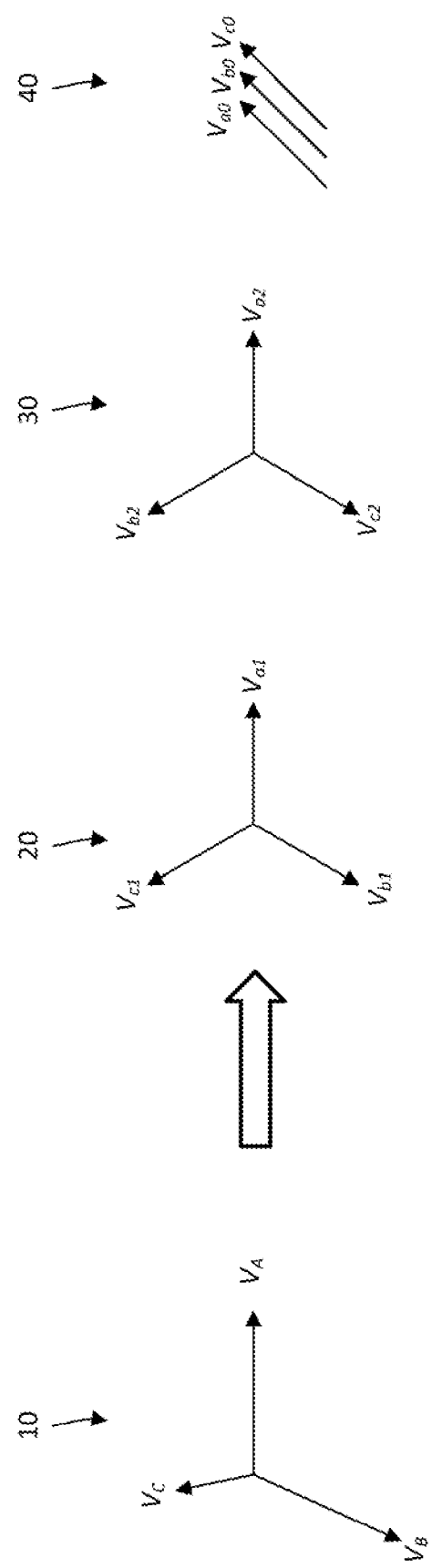
FIG. 1 depicts three-phase unbalanced system and its corresponding positive, negative, and zero sequence symmetrical components.
Figure 2:
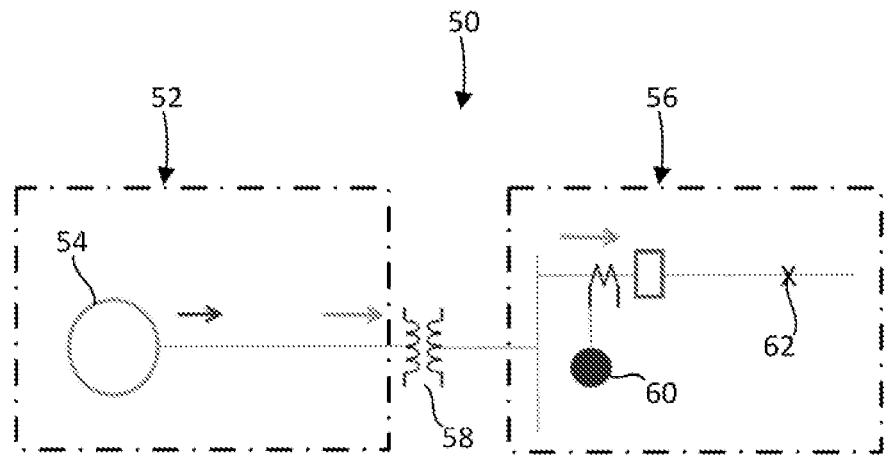
FIG. 2 depicts a conventional electrical power generation and distribution system having a single IBR.
Figure 3:
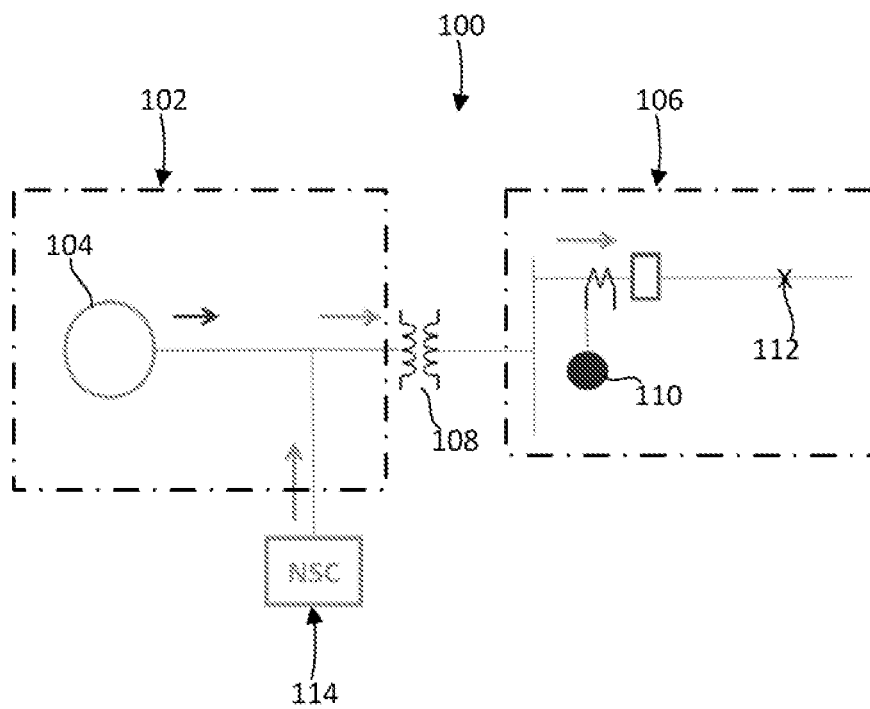
FIG. 3 depicts an electrical power generation and distribution system having a single IBR and a negative sequence converter device according to an embodiment of the present invention.

Referring now to FIG. 3, there is provided an improved electrical power generation and distribution system 100 according to an embodiment of the present invention. System 100 includes a power generation portion 102 having an IBR 104, such as a solar panel array or another green (i.e., renewable) power generation source. The system 100 includes a power transmission portion 106 that is connected to the power generation portion 102 via a step-up transformer 108. The power transmission portion 106 includes a conventional protective relay 110 that is used in isolating and protecting the system 100 against faults 112. Lastly, unlike the conventional system 50 (shown in FIG. 1), this improved system 100 includes a negative sequence converter (NSC) device 114 according to embodiment of the present invention.

Figure 4:
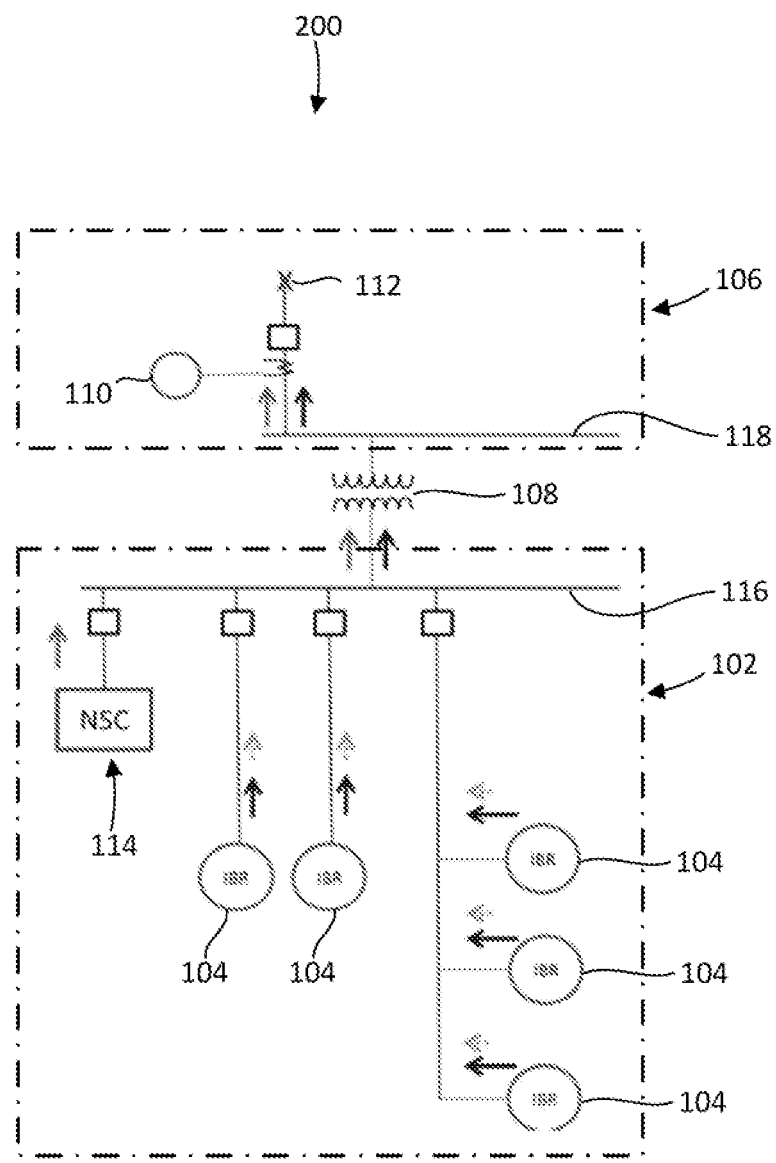
FIG. 4 depicts another electrical power distribution system having an NSC device connected to a low-voltage utility collector bus along with several IBRs.
Figure 7:
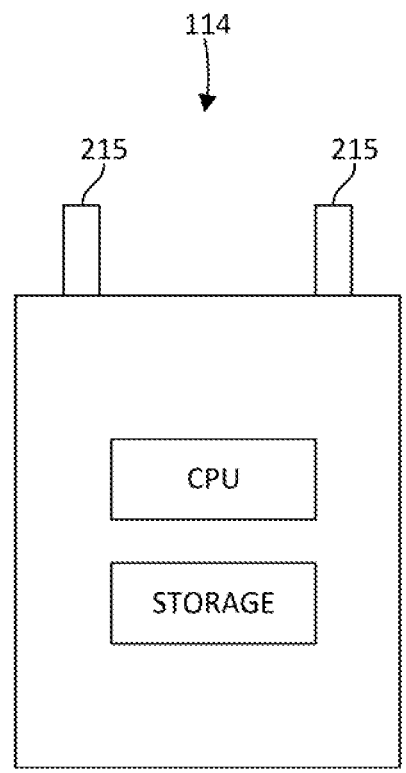
FIG. 7 depicts an NSC device having terminals for connecting to a power system according to an embodiment of the present invention.

In FIG. 4, another electrical power generation and distribution system 200 according to an embodiment of the present invention is shown. Like the previously shown system 100, this system 200 includes a power generation portion 102 and a power transmission portion 106 that is connected to the power generation portion via a step-up transformer 108. The power transmission portion 106 includes a conventional protective relay 110 that is used in isolating and protecting the system 200 against faults 112. Again, an NSC device 114 allows for the relay 110 to protect the system 200 against balanced and unbalanced faults. However, unlike the previously shown system 100, this system 200 has multiple IBRs 104 that are connected together by a low-voltage collector bus 116. Similarly, relay 110 is connected to a high-voltage collector bus 118 on the opposite side of transformer 108. In this system 200, a single NSC device 114 could be installed with multiple IBRs 104 (e.g., at a ratio of 10-20 IBRs to one NSC device). With reference to FIG. 7, an NSC device 114 having terminals 115 for connecting the NSC device to a collector bus, such as bus 116 (shown in FIG. 4).

In each of the above-mentioned cases, the primary purpose of the NSC device is to produce and inject negative sequence current only into a utility bus in response to an unbalanced fault condition in the grid. Preferably, the NSC device does not produce (or actively suppresses) positive sequence current or zero sequence current. As such, the full current capability of the NSC device 100 would be used to produce negative sequence current. The negative sequence current provided by NSC device 100 has sufficient magnitude and the correct phase angle that will be detectable by conventional protective relays. Advantageously, in certain embodiments, this apparatus 100 is provided as a separate add-on component that may be added to existing power generation and distribution systems that will enable the existing protective relays associated with that system to correctly detect and respond to unbalanced faults. This apparatus 100 will, therefore, allow for conventional protective relays to protect grids that utilize IBRs, where the negative sequence current provided by those IBRs without the NSC would have been inadequate to allow the protective relay to function properly. The NSC device 100 may also be configured to serve a secondary purpose when no faults are detected. For example, the NSC device 100 may be configured to improve nominal power quality when no faults are detected and to automatically switch into a fault mode when an unbalanced fault occurs.

Figure 5:
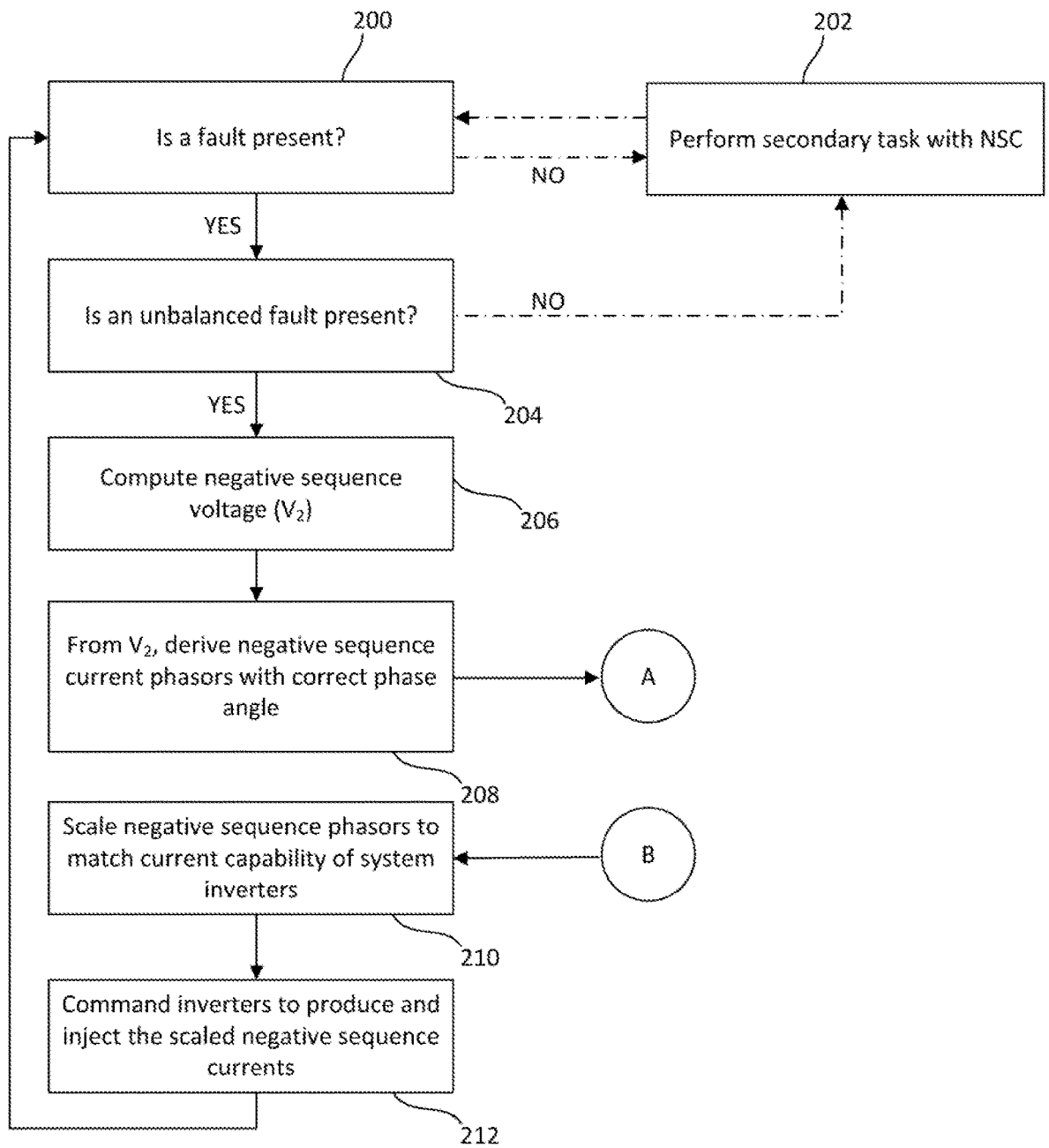
FIGS. 5 and 6 provide a flowchart that depicts a sequence of steps used by an IBR-based power generation and distribution system provided with an NSC device to detect and address a fault according to an embodiment of the present invention.
Figure 6:
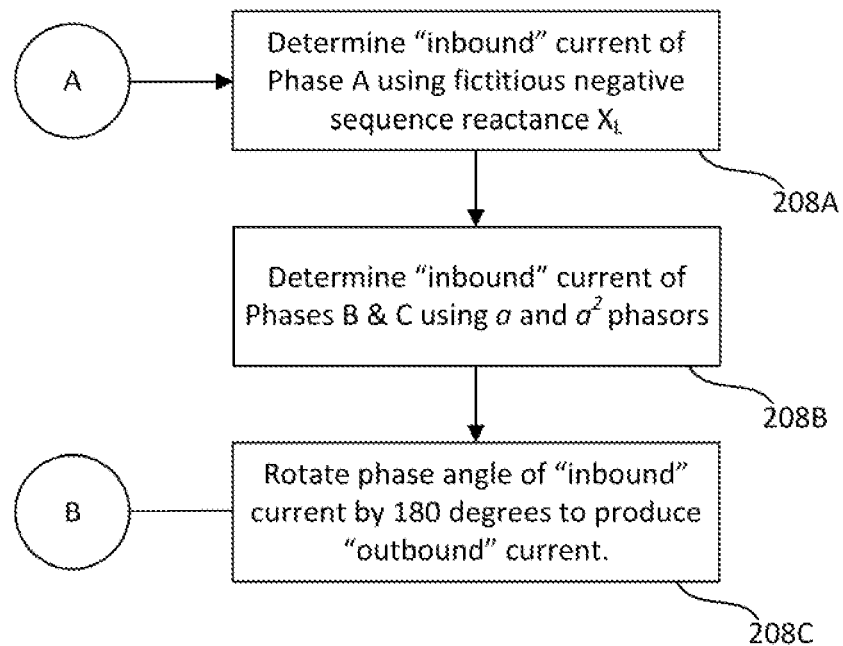

With reference now to FIGS. 5 and 6, there is provided a flow chart illustrating a sequence of steps used by an IBR-based power generation and distribution system provided with an NSC device to detect and address a fault according to an embodiment of the present invention. At Step 200, the NSC first determines if a fault is present in the system by considering the terminal voltages of the power generation portion or power transmission portion of the system. Voltages are normally near 100% (nominal) when the system is functioning properly. However, when a fault is present, one or more of the phase voltages will be less than 100%. The NSC may be provided with pre-set voltage threshold that serves as a trigger to indicate the presence of a possible fault. For example, in certain embodiments, the threshold might be set at 80% of the nominal (i.e., maximum or 100%) voltage. In other cases, the threshold is set at 70% of the nominal voltage. In preferred embodiments, the NSC permits a user-selectable threshold value to be selected in order to customize the system and to provide the desired level of sensitivity.

When the terminal voltage is above the specified threshold value, the NSC may optionally be configured to perform a secondary function at Step 202, such as functioning as a static VAR compensator (SVC) device to regulate transmission voltage or improve power quality, or other similar functions. Persons of skill in the art will appreciate that the precise secondary functions provided by the NSC will depend on the nature of the power electronic scheme in which the NSC is utilized On the other hand, the terminal voltage falling below the specified threshold value is indicative of a fault condition. Once the terminal voltage falls below the specified threshold value, the NSC is preferably configured to automatically switch into a fault mode and begin to take steps to identify the type of fault and to produce appropriate negative sequence current.

Once a fault is detected, the NSC determines if the fault is a balanced (i.e., symmetrical) fault, the most rare type of fault, or a much more common unbalanced fault at Step 204. As discussed above, a balanced fault is one that affects all three phases equally, such as when all three phases are shorted to ground. However, the majority of faults in power systems are "asymmetrical" or "unbalanced" faults, where all three phases are not affected equally. These include line-to-ground, phase-phase, or phase-phase-ground fault types. In the case of an unbalanced fault, the phase voltage is determined. As mentioned above, analyzing balanced three-phase faults is relatively straightforward. On the other hand, analyzing unbalanced three-phase was difficult, but that analysis was simplified through the use of symmetrical components. As shown below, a first step in that analysis (Step 206) is to compute the negative sequence voltage ($V_2$).

A vector for a three-phase system can be written as follows:

$$V_{ABC} = \begin{bmatrix} V_A \\ V_B \\ V_C \end{bmatrix}$$

In the case of an unbalanced system, this vector of unbalanced phasors can be further decomposed into the three symmetrical or balanced components below, where the subscripts 0, 1, and 2 refer to the zero, positive, and negative sequences ($V_0$, $V_1$, and $V_2$), respectively.

$$V_{ABC} = \begin{bmatrix} V_A \\ V_B \\ V_C \end{bmatrix} = \begin{bmatrix} V_{a,0} \\ V_{b,0} \\ V_{c,0} \end{bmatrix} + \begin{bmatrix} V_{a,1} \\ V_{b,1} \\ V_{c,1} \end{bmatrix} + \begin{bmatrix} V_{a,2} \\ V_{b,2} \\ V_{c,2} \end{bmatrix}$$

With respect to the positive sequence and negative sequence, since they are each balanced, the magnitude of each of their three phasors is equal and the only difference is the angular displacement between those phasors. On the other hand, the zero sequence components have equal magnitude and are each in phase with one another. Using these facts, a phasor a (i.e., $1\angle 120°$) can be defined which rotates the sequence component counterclockwise by 120 degrees when multiplied by that phasor, and a phasor $a^2$ (i.e., $1\angle 240°$) can be defined which rotates the sequence component counterclockwise by 240 degrees when multiplied by that phasor. These a and $a^2$ phasors, thus, allow two of the sequence components to be defined in terms of the third sequence component. Therefore, for the positive sequence ($V_1$) and negative sequence ($V_2$):

$$V_1 = V_{a,1} = a^2 V_{b,1} = a V_{c,1}$$

$$V_2 = V_{a,2} = a V_{b,2} = a^2 V_{a,2}$$

and for the zero sequence:

$$V_0 = V_{a,0} = V_{b,0} = V_{c,0}$$

In the example given above, the angle of phases B and C are described with the angle of phase A as the reference point. In other words, the phase angle of Phase B may be expressed as the phase angle of Phase A plus 240 degrees, and the phase angle of Phase C may be expressed as the phase angle of Phase A plus 120 degrees. However, other phases could also serve as the reference phase.

Next, the vector for the three-phase system may be rewritten as follows:

$$V_{ABC} = \begin{bmatrix} V_A \\ V_B \\ V_C \end{bmatrix} = \begin{bmatrix} V_0 \\ V_0 \\ V_0 \end{bmatrix} + \begin{bmatrix} V_1 \\ a^2 V_1 \\ a V_1 \end{bmatrix} + \begin{bmatrix} V_2 \\ a V_2 \\ a^2 V_2 \end{bmatrix} = \begin{bmatrix} 1 & 1 & 1 \\ 1 & a^2 & a \\ 1 & a & a^2 \end{bmatrix} \begin{bmatrix} V_0 \\ V_1 \\ V_2 \end{bmatrix} = A V_{012}$$

where:

$$V_{012} = \begin{bmatrix} V_0 \\ V_1 \\ V_2 \end{bmatrix} \text{ and } A = \begin{bmatrix} 1 & 1 & 1 \\ 1 & a^2 & a \\ 1 & a & a^2 \end{bmatrix}$$

Thus, the positive, negative, and zero sequence components ($v_{012}$) may be determined from the three-phase voltage components ($V_{ABC}$) using the inverse of the "A" matrix, as shown below:

$$v_{012} = A^{-1} V_{ABC}$$

where:

$$A^{-1} = \frac{1}{3}\begin{bmatrix} 1 & 1 & 1 \\ 1 & a & a^2 \\ 1 & a^2 & a \end{bmatrix}$$

Notably, since the above "A" matrix is generated using a and $a^2$ phasors that were created in reference to the A phase, the A matrix is used only for calculating the symmetrical components of the A phase of this particular set of ABC rotation phasors. For that reason, positive, negative, and zero sequence components determined using the above calculation are for the A phase only. The matrix equation above can be rewritten as individual equations that separately calculate the positive, negative and zero sequence voltage phasors for the A phase, as shown below:

$$V_{a,0} = \frac{1}{3}(V_A + V_B + V_C)$$

$$V_{a,1} = \frac{1}{3}(V_A + aV_B + a^2 V_C)$$

$$V_{a,2} = \frac{1}{3}(V_A + a^2 V_B + aV_C)$$

In preferred embodiments, the NSC of the present invention is configured to determine the unbalanced three-phase voltage components by considering the terminal voltages of the power generation portion or power transmission portion of the system and then, based on that information, to calculate the negative sequence voltage using the procedure outlined above.

Next, once the negative sequence voltage ($V_2$) has been determined, the NSC derives the corresponding negative sequence current for Phase A (i.e., $I_{A,2}$) by applying a fictitious negative sequence reactance $X_L$ equal to 1 ∠90° Ω to produce the proper 90 degree relationship between the negative sequence voltage and the negative sequence current (Step 208A). Once the correct phase angle for the A-phase of the negative sequence current is determined, the correct phase angle for the B- and C-phases can also be determined using the a and $a^2$ phasors mentioned above (Step 208B). Again, since this is a balanced phasor, each of the phases are separated by exactly 120 degrees with respect to the other phases. Therefore, the phase angles of the B- and C-phases of the negative sequence current is determined by multiplying the A-phase by the a and $a^2$ phasors. The three phase angles calculated above represent the "inbound" currents traveling into the NSC. To account for electrical polarity, those currents must be converted to "outbound" currents traveling out of the NSC that are then injected into the bus. This is accomplished by adding or subtracting 180 degrees to the phase angles determined above (Step 208C). Once the correct "outbound" phase angle for each of the three phases of the negative sequence current is determined, the current is scaled either up or down to equal the current capability of the inverter (Step 210). From there, the NSC instructs power electronics to inject the scaled negative sequence current into the bus at the correct "outbound" phase angles for each of the three phases (Step 212). Preferably, only negative sequence current is injected into the bus.

Example

In this example, an NSC of the present invention is used in connection with a 161 kV bus in an ABC phase rotation system, where a phase-to-ground fault occurs that impacts the A-phase only, to carry out the steps described below. Start with phase voltages during A-ground fault:

$$V_{ABC} = \begin{bmatrix} 0 \\ 86.6 \angle -110.2° \\ 83.7 \angle -107.1° \end{bmatrix} kV$$

Calculate resulting voltage for Phase A ($V_{A,2}$):

$$V_{a,2} = \frac{1}{3}(0 + 86.6 \angle 129.8° + 83.7 \angle -132.9°) = 37.5 \text{ kV} \angle 177.3°$$

Calculate resulting "inbound" current for Phase A ($I_{a,2}$) using $X_f$:

$I_{a,2}$=37.5 kA∠87.3°

Current scaled to inverter capacity (e.g., 300A) for a full set of "inbound" phase currents to be produced by NSC with reference into (i.e., incident on) the NSC using a and $a^2$ phasors:

$I_A$=300 A∠87.3°,$I_B$=300 A∠207.3θ,$I_C$=300 A∠−32.7°

Calculate full set of "outbound" phase currents to be produced by NSC by rotating the inbound phase currents by 180 degrees:

$I_A$=300 A∠−92.7°,$I_B$=300 A∠27.3°,$I_C$=300 A∠147.3®

Injecting the above negative sequence currents into the bus will, preferably, provide a sufficient magnitude and proper phase angle to allow the conventional negative sequence protective relays to determine fault direction and operate properly. Thus, the foregoing invention provides a method and apparatus for enabling power systems, especially in the case of systems with high penetration of IBR, to detect and correctly respond to unbalanced faults. Advantageously, unlike earlier-proposed solutions, the present invention does not require the replacement of conventional components with those that are better suited for IBR installations.

Although this description contains many specifics, these should not be construed as limiting the scope of the invention but as merely providing illustrations of some of the presently preferred embodiments thereof, as well as the best mode contemplated by the inventor of carrying out the invention. The invention, as described herein, is susceptible to various modifications and adaptations as would be appreciated by those having ordinary skill in the art to which the invention relates.

What is claimed is:

1. A method for providing negative sequence current to a bus of an IBR-based power system to facilitate operation of a protective relay of the power system in protecting the power system, the method comprising the steps of:
   using a negative sequence converter (NSC) device connected to the power system via terminals, monitoring phase voltages of the power system at the terminals;
   using the NSC device, determining a reference magnitude and reference phase angle of a negative sequence voltage incident on the NSC device based on phase voltages of the power system;
   using the NSC device, providing a first model current having a first magnitude and a first phase angle based on the reference magnitude and reference phase angle;
   using the NSC device, providing a second model current having a second and different magnitude from the first magnitude and also having a second phase angle; and
   using the NSC device, providing the second model current to the power system bus.

2. The method of claim 1 wherein the phase angle of the first model current is equal to the reference phase angle of the negative sequence voltage incident on the NSC device rotated by 90 degrees.

3. The method of claim 1 wherein the first magnitude is equal to the reference magnitude of the negative sequence voltage.

4. The method of claim 1 wherein the second model current comprises three phases, each one of the three phases of the first model current corresponding with one of the three phases of the second model current, wherein the second magnitude for each phase is equal to one another and wherein 120 degrees separates the second phase angles of each of the phases.

5. The method of claim 4 wherein the first model current comprises three phases, each with a first phase angle, that each correspond with one of the three phases of the second model current, wherein 120 degrees separates the first phase angles of each of the three phases of the first model current and 180 degrees separates the first phase angles of each phase of the first model current from the second phase angle of each corresponding phase of the second model current.

6. The method of claim 4 wherein the power system includes an inverter having a current capability and wherein the second magnitude to each phase of the second model current is equal to the current capability of the inverter.

7. The method of claim 1 further comprising the steps of, with the NSC device, detecting a fault in the power system when a system voltage is below a pre-selected threshold percentage of a nominal voltage for the power system; and, once a fault is detected, switching the NSC device from a non-fault mode of operation to a fault mode of operation.

8. The method of claim 7 wherein the NSC device switches from the non-fault mode of operation to the fault mode of operation when the system voltage falls below 80% of the nominal voltage for the power system.

9. The method of claim 7 wherein the NSC device switches from the non-fault mode of operation to the fault mode of operation when the system voltage falls below 70% of the nominal voltage for the power system.

10. The method of claim 7 wherein the NSC device carries out a secondary, non-fault related function when the NSC device is in non-fault mode.

11. The method of claim 10 wherein the NSC device functions as a static VAR compensator in the non-fault mode.

12. The method of claim 10 wherein the NSC device improves nominal power quality of the power system in the non-fault mode.

13. The method of claim 1 wherein the second model current provided to the power system bus consists of negative sequence current.

14. The method of claim 1 wherein the second magnitude is greater than the first magnitude.

15. The method of claim 1 wherein the second magnitude is less than the first magnitude.

16. A method for providing negative sequence current to a bus of an IBR-based power system to facilitate operation of protective relays in protecting the power system, the method comprising the steps of:
   monitoring phase voltages at terminals connected to the power system;
   determining a reference phasor of a negative sequence voltage incident on the terminals having a reference magnitude and reference phase angle;
   applying a rotation phasor to the reference phasor based on an angular offset between the negative sequence voltage and a corresponding negative sequence current to obtain a first outbound negative sequence current having a first magnitude and a first phase angle;
   scaling the first outbound negative sequence current to obtain a second outbound negative sequence current having a second magnitude that is different from the first magnitude and that is oriented at the first phase angle;
   providing the second outbound negative sequence current to the bus of the power system.

17. The method of claim 16 wherein the second outbound negative sequence includes a first phase, second phase, and third phase that each have a magnitude equal to the second magnitude and wherein 120 degrees separates each adjacent phase.

18. The method of claim 16 further comprising the steps of:
   providing a first phase of the outbound negative sequence having a magnitude equal to the second magnitude and a phase angle obtained by applying a first rotation phasor to the reference phasor, where the first rotation phasor is based on the angular offset between the negative sequence voltage and corresponding negative sequence current;
   providing a second phase of the outbound negative sequence having a magnitude equal to the second magnitude and a phase angle obtained by applying a second rotation phasor to the reference phasor, where the second rotation phasor is based on the angular offset between the negative sequence voltage and corresponding negative sequence current; and
   providing a third phase of the outbound negative sequence having a magnitude equal to the second magnitude and a phase angle obtained by applying a third rotation phasor to the reference phasor, where the third rotation phasor is based on the angular offset between the negative sequence voltage and corresponding negative sequence current, wherein 120 degrees separates the phase angles of the first phase, second phase, and third phase of the outbound negative sequence.

19. The method of claim 16 wherein the first outbound negative sequence current is scaled such that the second magnitude equals a current capacity of an inverter of the power system.

\* \* \* \* \*